(12) United States Patent
Hayashishita et al.

(10) Patent No.: US 8,476,740 B2
(45) Date of Patent: Jul. 2, 2013

(54) SHEET FOR PROTECTING SURFACE OF SEMICONDUCTOR WAFER, SEMICONDUCTOR DEVICE MANUFACTURING METHOD AND SEMICONDUCTOR WAFER PROTECTION METHOD USING SHEET

(75) Inventors: Eiji Hayashishita, Nagoya (JP);
Yoshihisa Saimoto, Sagamihara (JP);
Makoto Kataoka, Nagoya (JP);
Katsutoshi Ozaki, Nagoya (JP);
Mitsuru Sakai, Kisarazu (JP)

(73) Assignee: Mitsui Chemicals Tohcello, Inc., Minato-Ku, Tokyo (JP)

( * ) Notice: Subject to any disclaimer, the term of this patent is extended or adjusted under 35 U.S.C. 154(b) by 0 days.

(21) Appl. No.: 13/520,110

(22) PCT Filed: May 31, 2011

(86) PCT No.: PCT/JP2011/003063
§ 371 (c)(1),
(2), (4) Date: Jun. 29, 2012

(87) PCT Pub. No.: WO2011/152045
PCT Pub. Date: Dec. 8, 2011

(65) Prior Publication Data
US 2012/0273975 A1    Nov. 1, 2012

(30) Foreign Application Priority Data

Jun. 2, 2010  (JP) .................................. 2010-127076

(51) Int. Cl.
*H01L 23/58* (2006.01)
*H01L 21/30* (2006.01)
*H01L 21/46* (2006.01)
*H01L 21/00* (2006.01)
*B32B 9/00* (2006.01)
*B32B 33/00* (2006.01)

(52) U.S. Cl.
USPC ........... 257/632; 438/118; 438/455; 438/459; 438/464; 428/41.7; 257/642; 257/635; 257/E23.002; 257/E21.499

(58) Field of Classification Search
USPC .................. 438/118, 455, 464; 257/632, 642, 257/635; 428/41.7, 343
See application file for complete search history.

(56) References Cited

U.S. PATENT DOCUMENTS 7,168,885 B2 * 1/2007 Rio et al. ......................... 404/72
7,358,158 B2 * 4/2008 Aihara et al. .................. 438/464

(Continued)

FOREIGN PATENT DOCUMENTS

CN    101116182 A    1/2008
JP    2004-006630 A   1/2004

(Continued)

OTHER PUBLICATIONS

International Search Report (PCT/ISA/210) issued on Aug. 16, 2011, by the Japanese Patent Office as the International Searching Authority for International Application No. PCT/JP2011/003063.

(Continued)

*Primary Examiner* — David Zarneke
(74) *Attorney, Agent, or Firm* — Buchanan Ingersoll & Rooney PC

(57) ABSTRACT

To provide a semiconductor wafer surface protection sheet having good adhesion to irregularities on a patterned surface of a semiconductor wafer and having good peelability after wafer grinding. Specifically, a semiconductor wafer surface protection sheet is provided that includes a base layer having a tensile elasticity at 25° C., E(25), of 1 GPa or more; a resin layer A that satisfies the condition $E_A(60)/E_A(25)<0.1$, where $E_A(25)$ is a tensile elasticity at 25° C. and $E_A(60)$ is a tensile elasticity at 60° C., the $E_A(60)$ ranging from 0.005 MPa to 1 MPa; and a resin layer B having a tensile elasticity at 60° C., $E_B(60)$, of 1 MPa or more and having a thickness of 0.1 μm to less than 100 μm, the $E_B(60)$ being larger than the $E_A(60)$ of the resin layer A.

15 Claims, 2 Drawing Sheets

U.S. PATENT DOCUMENTS

| | | | |
|---|---|---|---|
| 7,847,184 B2* | 12/2010 | Hayes et al. | 136/251 |
| 8,080,727 B2* | 12/2011 | Chou | 136/251 |
| 8,329,276 B2* | 12/2012 | Cruz | 428/40.1 |
| 2003/0054643 A1* | 3/2003 | Aihara et al. | 438/689 |
| 2003/0219960 A1 | 11/2003 | Fukumoto et al. | |
| 2005/0031822 A1* | 2/2005 | Aihara et al. | 428/40.1 |
| 2005/0031861 A1 | 2/2005 | Matsumura et al. | |
| 2005/0196942 A1 | 9/2005 | Okada et al. | |
| 2006/0252234 A1 | 11/2006 | Saiki | |
| 2008/0020575 A1 | 1/2008 | Saimoto et al. | |
| 2008/0185700 A1* | 8/2008 | Takamatsu et al. | 257/678 |
| 2010/0143633 A1* | 6/2010 | Kanada et al. | 428/41.7 |
| 2012/0309170 A1* | 12/2012 | Hayashishita et al. | 438/464 |

FOREIGN PATENT DOCUMENTS

| | | |
|---|---|---|
| JP | 2004-031565 | 1/2004 |
| JP | 2004-363139 A | 12/2004 |
| JP | 2005-053998 A | 3/2005 |
| JP | 2005-191296 A | 7/2005 |
| JP | 2005-243909 A | 9/2005 |
| JP | 2005-347382 A | 12/2005 |
| JP | 2006-124432 | 5/2006 |
| WO | WO 2005/004216 A1 | 1/2005 |
| WO | WO 2006/088074 A1 | 8/2006 |

OTHER PUBLICATIONS

Nakamura et al., "Study on Interfacial Strength Properties between PBO Fiber Modified by Oxygen Plasma Treatment and Epoxy Resin", Journal of the Society of Materials Science, Japan, vol. 55, No. 1, pp. 83-88, Jan. 2006.

* cited by examiner

SHEET FOR PROTECTING SURFACE OF SEMICONDUCTOR WAFER, SEMICONDUCTOR DEVICE MANUFACTURING METHOD AND SEMICONDUCTOR WAFER PROTECTION METHOD USING SHEET

TECHNICAL FIELD

The present invention relates to a semiconductor wafer surface protection sheet, a method of protecting a semiconductor wafer using the same, and a method of manufacturing a semiconductor device using the same.

BACKGROUND ART

During the grinding step of the non-patterned surface of a semiconductor wafer in a manufacturing process of semiconductor devices from a semiconductor wafer, a semiconductor wafer surface protection sheet is attached to the patterned surface of the semiconductor wafer in order to prevent possible damage to the patterned surface.

The patterned surface of a semiconductor wafer has irregularities that include not only circuits, but also relatively high differences in level such as semiconductor bumps. Thus, when attaching a semiconductor wafer surface protection sheet to the semiconductor wafer, creation of voids between the semiconductor wafer surface protection sheet and the irregularity on the patterned surface of the semiconductor wafer results in a uneven distribution of stress across the surface of the semiconductor wafer upon grinding of its non-patterned surface, making the semiconductor wafer liable to breakage. To avoid this problem, semiconductor wafer surface protection sheets have been proposed that can well adjust to surface irregularities.

For example, Patent Literature 1 proposes a semiconductor wafer surface protection sheet made of particular elastomer composition. Patent Literatures 2 and 3 proposes a semiconductor wafer surface protection sheet that includes a base layer, an irregularity absorbing layer, and an adhesive layer.

CITATION LIST

Patent Literature

[PTL 1] Japanese Patent Application Laid-Open No. 2005-191296
[PTL 2] Japanese Patent Application Laid-Open No. 2004-363139
[PTL 3] Japanese Patent Application Laid-Open No. 2005-243909
[PTL 4] WO2006/088074

SUMMARY OF INVENTION

Technical Problem

The semiconductor wafer surface protection sheets disclosed by Patent Literatures 1 to 4 have somewhat improved adjustability to surface irregularities. However, the semiconductor wafer surface protection sheets become less peelable from the semiconductor wafer depending on the state of the patterned surface of the semiconductor wafer.

Specifically, in some cases, a circuit protection film having porous structure or asperities is formed previously on the patterned surface of a semiconductor wafer. For example, in some cases, a circuit protection film made of polybenzoxazole is subjected to plasma treatment (see Japanese Patent Application Laid-Open Nos. 2006-124432 and 2004-31565). This causes rise in the number of irregularities on the circuit protection film surface (see Journal of the society of materials science and Japan Vol. 55 No. 1 p. 83-88 January 2006). This is to make the circuit protection layer porous for reduced permittivity, in order to reduce transmission delay of high-frequency signals along with increasing transmission speed and frequency of electrical signals. When the above semiconductor wafer surface protection sheet is attached to such a porous circuit protection layer, the materials of the irregularity absorbing layer and adhesive layer flow into the pores, making difficult peeling of the semiconductor wafer surface protection sheet after grinding in some cases. Moreover, with increasing packaging density, the shape of the irregularities on the patterned surface of a semiconductor wafer is becoming more complex, causing the materials of the irregularity absorbing layer and adhesive layer to flow into the gaps at the irregularities, which in some cases makes peeling of the semiconductor wafer surface protection sheet difficult after grinding.

The present invention has been made in view of the foregoing circumstances. An object of the present invention is to provide a semiconductor wafer surface protection sheet that has good adhesion to irregularities on a patterned surface of a semiconductor wafer and has good peelability after grinding, and a method of protecting a semiconductor wafer using the semiconductor wafer surface protection sheet. Another object of the present invention is to provide a semiconductor wafer surface protection sheet that may have good peelability even from a porous circuit protection layer or from a patterned surface with complex irregularities.

Solution to Problem

The inventors have established that a semiconductor wafer surface protection sheet that includes resin layer A, which is an irregularity absorbing layer, and resin layer B which has a higher elastic modulus than resin A has high peelability while ensuring adjustability to irregularities on the patterned surface of a semiconductor wafer. The inventors have also established that high adjustability to surface irregularities and high peelability can be achieved at the same time by adjusting the balance of tensile elasticity and thickness between resin layer A and resin layer B. The present invention has been made based on these findings.

Specifically, a first aspect of the present invention relates to a semiconductor wafer surface protection sheet.

[1] A semiconductor wafer surface protection sheet including;
  a base layer having a tensile elasticity at 25° C., E(25), of 1 GPa or more;
  a resin layer A that satisfies the condition $E_A(60)/E_A(25) < 0.1$, where $E_A(25)$ is a tensile elasticity at 25° C. and $E_A(60)$ is a tensile elasticity at 60° C., the $E_A(60)$ ranging from 0.005 MPa to 1 MPa; and
  a resin layer B having a tensile elasticity at 60° C., $E_B(60)$, of 1 MPa or more and having a thickness of 0.1 μm to less than 100 μm, the $E_B(60)$ being larger than the $E_A(60)$ of the resin layer A,
  wherein the resin layer A is disposed between the base layer and the resin layer B.

[2] The semiconductor wafer surface protection sheet according to [1], wherein the resin layer B is disposed at an outermost surface of the semiconductor wafer surface protection sheet.

[3] The semiconductor wafer surface protection sheet according to [1] or [2], wherein the resin layer A contains an olefin copolymer.
[4] The semiconductor wafer surface protection sheet according to any one of [1] to [3], wherein the resin layer A has a density of 800 kg/m³ to 890 kg/m³.
[5] The semiconductor wafer surface protection sheet according to any one of [1] to [4], wherein the resin layer B contains at least one resin selected from the group consisting of polyethylene elastomer and polystyrene elastomer.
[6] The semiconductor wafer surface protection sheet according to any one of [1] to [5], wherein the base film is at least one layer selected from the group consisting of a polyolefin film, a polyester film, and a laminate film of polyolefin layer and polyester layer.
[7] The semiconductor wafer surface protection sheet according to any one of [1] to [6], wherein thickness $t_A$ of the resin layer A is larger than a difference in level on a patterned surface of a semiconductor wafer.

A second aspect of the present invention relates to a method of protecting a semiconductor wafer using the semiconductor wafer surface protection sheet.

[8] A method of protecting a semiconductor wafer including:
a first step of attaching the semiconductor wafer surface protection sheet according to [1] to a patterned surface of the semiconductor wafer at 40° C. to 80° C. under a pressure of 0.3 MPa to 0.5 MPa;
a second step of grinding a non-patterned surface of the semiconductor wafer to which the semiconductor wafer surface protection sheet is attached;
a third step of processing the non-patterned surface of the semiconductor wafer after grinding; and
a fourth step of peeling the semiconductor wafer surface protection sheet.
[9] The method according to [8], wherein the patterned surface of the semiconductor wafer has a difference in level of 200 μm or higher.
[10] The method according to [8] or [9], wherein the semiconductor wafer further includes a porous circuit protection layer attached to the patterned surface.
[11] The method according to any one of [8] to [10], wherein the third step includes at least one step selected from the group consisting of metal sputtering step, plating step, and heating step.

A third aspect of the present invention relates to a method of manufacturing a semiconductor device using the semiconductor wafer surface protection sheet.

[12] A method of manufacturing a semiconductor device including:
a first step of attaching the semiconductor wafer surface protection sheet according to [1] to a patterned surface of a semiconductor wafer at 40° C. to 80° C. under a pressure of 0.3 MPa to 0.5 MPa;
a second step of grinding a non-patterned surface of the semiconductor wafer to which the semiconductor wafer surface protection sheet is attached;
a third step of processing the non-patterned surface of the semiconductor wafer after grinding; and
a fourth step of peeling the semiconductor wafer surface protection sheet.
[13] The method according to [12] wherein the patterned surface of the semiconductor wafer has a difference in level of 200 μm or higher.
[14] The method according to [12] or [13], wherein the semiconductor wafer further includes a porous circuit protection layer attached to the patterned surface.
[15] The method according to any one of [12] to [14], wherein the third step includes at least one step selected from the group consisting of metal sputtering step, plating step, and heating step.

Effects of Invention

A semiconductor wafer surface protection sheet of the present invention has good adhesion to irregularities on the patterned surface of a semiconductor wafer; and good peelability after grinding. Further, a semiconductor wafer surface protection sheet of the present invention may have good peelability from a porous circuit protection layer.

DESCRIPTION OF EMBODIMENTS

1. Semiconductor Wafer Surface Protection Sheet

Figure 1:
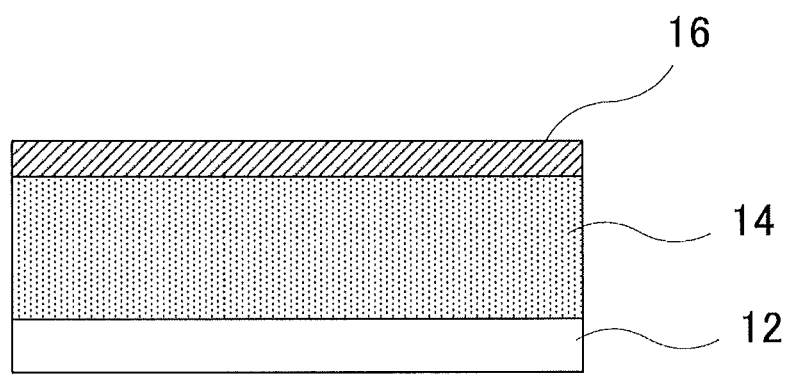
FIG. 1 shows an example of a semiconductor wafer surface protection sheet.

A semiconductor wafer surface protection sheet of the present invention includes a base layer, a resin layer A and a resin layer B, wherein at least one resin layer A is disposed between the base layer and resin layer B.

When attaching the sheet under warming the resin layer A preferably exhibits good adhesion to a patterned surface of a semiconductor wafer while adjusting to irregularities on the patterned surface, as well as retains (fixes) its shape at ambient temperature after attached. For this, resin layer A preferably has hot melt property so as to undergo plastic deformation. Thus, tensile elasticity at 25° C., $E_A(25)$, and tensile elasticity at 60° C., $E_A(60)$, preferably satisfy the condition $E_A(60)/E_A(25)<0.1$. In particular, it is more preferable that the condition $E_A(60)/E_A(25)<0.08$ be satisfied, and it is further preferable that the condition $E_A(60)/E_A(25)<0.05$ be satisfied.

Tensile elasticity $E_A(60)$ of resin layer A is preferably 0.005 MPa to 1.0 MPa, more preferably 0.01 MPa to 0.5 MPa. Tensile elasticity $E_A(25)$ of resin layer A is preferably 1 MPa to 10 MPa, more preferably 2 MPa to 9 MPa. When tensile elasticity $E_A(60)$ falls within the range, resin layer A becomes flowable when attaching the sheet under warming and thus can well adjust to surface irregularities. On the other hand, when tensile elasticity $E_A(25)$ falls within the range, resin layer A can retain its shape at ambient temperature after sheet attachment and thus can ensure adhesion during processing.

Tensile elasticity of the resin can be measured in the following procedure:
1) As a specimen, for example, a sample film with an initial dimension of 140 mm length, 10 mm width and 75 μm to 100 μm thick is provided;
2) Tensile test is then conducted under the following conditions to measure elongation (mm) of the sample: measurement temperature 25° C., distance between chucks=100 mm, and tensile speed=50 mm/min; and
3) A tangent line is drawn to the initial rising section of the obtained stress-strain curve (S-S curve), and the gradient of the tangent line is divided by cross sectional area of the sample film to find tensile elasticity.

The density of resin layer A is preferably 800 kg/m³ to 890 kg/m³, more preferably 830 kg/m³ to 890 kg/m³, further preferably 850 kg/m³ to 890 kg/m³. When the density of resin layer A is less than 800 kg/m³, the elasticity becomes so low that shape retention ability decreases. On the other hand, when the density of resin layer A exceeds 890 kg/m³, elasticity becomes so high that adjustability to surface irregularities decreases.

There is no particular limitation on the resins used for resin layer A as long as the above conditions for tensile elasticity are satisfied; olefin copolymer are preferable. Olefin copolymers that have $C_{2-12}$ α-olefins as main component units are preferable.

Examples of the $C_{2-12}$ α-olefins include ethylene, propylene, 1-butene, 1-pentene, 3-methyl-1-butene, 1-hexene, 4-methyl-1-pentene, 3-methyl-1-pentene, 1-heptene, 1-octene, 1-decene, and 1-dodecene.

In particular, for their high adjustability to surface irregularities upon attaching, ethylene-α-olefin copolymers such as ethylene-propylene copolymer, ethylene-1-butene copolymer, terpolymers of ethylene-propylene-$C_{4-12}$ α-olefins; and terpolymers of propylene-1-butene copolymer-$C_{5-12}$ α-olefins are preferable, with ethylene-propylene copolymer being more preferable because propylene improves hot melt property of olefin copolymers. Commercially available α-olefin copolymers include TAFMER® manufactured by Mitsui Chemicals, Inc.

The tensile elasticity of resin layer A is adjusted by the monomer type, comonomer ratio, modification, etc., of the olefin copolymer. Reduction of the tensile elasticity at 60° C. of the olefin copolymer is accomplished by, for example, increasing propylene ratio, modifying the olefin copolymer carboxylic acid, and so forth.

Resin layer A may contain additional resin or additives as long as such characteristics as good adhesion or peelability to or from semiconductor wafers do not deteriorate. Examples of such additives include UV absorbers, antioxidants, heat stabilizers, lubricants, softening agents, and adhesion improvers.

There is no particular limitation on thickness $t_A$ of resin layer A as long as it can fully accommodate irregularities (including semiconductor bumps) on the patterned, surface of a semiconductor wafer. For example, when the irregularities have a difference in level of the order of 100 μm, thickness tA of resin layer A may be set to 100 μm to 200 μm.

For increased peelability, it is preferable that resin layer B do not become excessively flowable upon sheet attachment under warming. For this, unlike resin layer A, it is preferable that resin layer B do not exhibit hot melt property upon sheet attachment under warming but undergo elastic deformation at least in the later-described step of attaching a semiconductor wafer surface protection sheet.

Thus, tensile elasticity at 60° C. of resin layer B, $E_B(60)$, is preferably higher than tensile elasticity at 60° C. of resin layer A, $E_A(60)$. However, it should be noted that preferably tensile elasticity $E_B(60)$ of resin layer B is not excessively high so as not to cause significant reduction in the resin layer A's ability of adjustability to (accommodating ability) surface irregularities.

Tensile elasticity $E_B(60)$ of resin layer B is preferably 1 MPa or more, but is preferably lower than the tensile elasticity at 60° C. of the base layer. Tensile elasticity $E_B(60)$ of resin layer B is preferably 1 MPa to 10 MPa, more preferably 1 MPa to 7 MPa. When tensile elasticity $E_B(60)$ of resin layer B is less than 1 MPa, resin layer B is glued to a semiconductor wafer more than necessary upon sheet attachment and thus peeling becomes difficult. On the other hand, when tensile elasticity $E_B(60)$ of resin layer B is excessively high, the resin layer becomes so hard that adjustability to surface irregularities decreases.

There is no particular limitation on the resin used for resin layer B as long as the above conditions for tensile elasticity are satisfied; thermoplastic elastomers are preferable. Examples of the thermoplastic elastomers include polystyrene elastomers, polyolefin elastomer, polyurethane elastomers, and polyester elastomers. Among them, polystyrene elastomers and polyolefin elastomers are preferable in view of the easiness with which to adjust adhesiveness and flexibility.

The polystyrene elastomers include styrene-isoprene-styrene block copolymer (SIS), styrene-ethylene-butylene-styrene block copolymer (SEBS), styrene-ethylene-propylene-styrene block copolymer (SEPS), and other styrene-diene block copolymers and hydrogenated products thereof (e.g., hydrogenated styrene-butadiene rubber (HSBR)).

The polyolefin elastomers include block copolymers of crystalline polyolefin blocks and non-crystalline monomer copolymer blocks. Specific examples thereof include olefin-ethylene-butylene-olefin block copolymers, polypropylene-polyethyleneoxide-polypropylene block copolymers, and polypropylene-polyolefin-polypropylene block copolymers. Commercially available polyolefin elastomers include Notio® manufactured by Mitsui Chemicals, Inc.

Thickness $t_B$ of resin layer B is preferably high enough not to cause reduction in the adjustability to surface irregularities. For this, thickness $t_B$ of resin layer B is preferably 0.1 μm to less than 100 μm, more preferably 1 μm to less than 100 μm. When thickness $t_B$ of resin layer B is less than 0.1 μm, it become difficult to exert resin layer B's peelability. On the other hand, when thickness $t_B$ of resin layer B is 100 μm or more, resin layer A's adjustability to surface roughness tends to decrease.

The base layer preferably has rigidity in order to suppress warpage or deformation of a semiconductor wafer. For this, the tensile elasticity at 25° C. of the base layer, E(25), is preferably 1 GPa or more.

Such a base layer is preferably a polyolefin film, a polyester film, or a laminate film of polyolefin layer and polyester layer, for example.

Examples of the polyolefin film include polypropylene film. Examples of the polyester film include polyethylene terephthalate film and polyethylene naphthalate film.

The thickness of the base layer is preferably about 5 μm to about 250 μm, more preferably 12 μm to 100 μm. The total thickness of the semiconductor wafer surface protection sheet is preferably 1,000 μm or less, more preferably 700 μm or less, in order to avoid poor workability upon sheet attachment or peeling.

The semiconductor wafer surface protection sheet may include additional layer(s) as needed. The additional layers include adhesive layer, separation film, etc. The adhesive layer is not particularly limited; for example, the adhesive layer may be ADMER® manufactured by Mitsui Chemicals, Inc. The separation film is not particularly limited; for example, a polyethylene terephalate film subjected to release treatment may be employed.

As described above, the semiconductor wafer surface protection sheet includes a base layer, a resin layer A and a resin layer B, wherein the resin layer A is disposed between the base layer and resin layer B. For its function of increasing peelability, resin layer B is preferably disposed at the outermost surface (not the one on the base layer side) of the semiconductor wafer surface protection sheet.

Resin layer A may be a mono-layer or a multiple-layer. In order to increase adhesion between resin layer A and base layer, an adhesive layer may be additionally disposed between resin layer A and base layer.

FIG. 1 shows an example of a configuration of a semiconductor wafer surface protection sheet. As illustrated in FIG. 1, semiconductor wafer surface protection sheet 10 includes, in order, base layer 12, resin layer A 14, and resin layer B 16. Semiconductor wafer surface protection sheet 10 is attached on the resin layer B 16 side to a patterned surface of a semiconductor wafer.

A semiconductor wafer surface protection sheet of the present invention can be manufactured by any method. For example, the semiconductor wafer surface protection sheet can be manufactured by: 1) co-extrusion in which the base film, resin layer A and resin layer B are co-extruded or in which resin layer A and resin layer B are co-extruded onto the base film; 2) lamination in which the baser film and films of resin layer A and resin layer B are laminated together; and so forth.

In the case of lamination, it is preferable to form an appropriate adhesive layer at the interface between the films as needed. For increased adhesion between the films, the interface between the films may be subjected to surface treatment such as corona discharge. Lamination may be effected either extrusion lamination or dry lamination. Films of resin layer A and resin layer B can be produced by, for example, extrusion molding.

2. Method of Protecting Semiconductor Wafer

One example of a method of protecting a semiconductor wafer using a semiconductor wafer surface protection sheet of the present invention includes: 1) a first step of attaching a semiconductor wafer surface protection sheet to a patterned surface of a semiconductor wafer under warming; 2) a second step of grinding a non-patterned surface of the semiconductor wafer to which the semiconductor wafer surface protection sheet is attached; 3) a third step of processing the non-patterned surface of the semiconductor wafer after grinding; and 4) a fourth step of peeling the semiconductor wafer surface protection sheet. These steps may be followed by a step of dicing the semiconductor wafer into chips, a step of encapsulating the chips, and so forth.

First, a semiconductor wafer on which circuits are patterned is provided. A circuit protection layer may be provided on the patterned surface of the semiconductor wafer in order to prevent possible damage to the circuits in subsequent steps.

It is only necessary that the circuit protection layer is made of insulating resin; for example, the circuit protection layer may be made of polyimide or polybenzoxazole. Moreover, in order to reduce transmission delay of high-frequency signals, the circuit protection layer may be made porous for reduced permittivity.

Figure 2A:
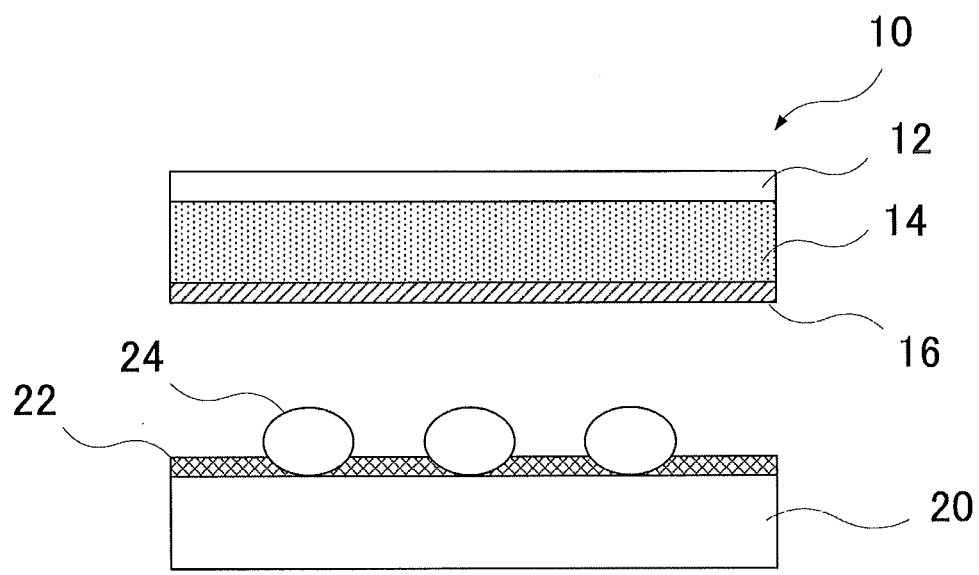
FIG. 2 shows an example of a step of attaching a semiconductor wafer surface protection sheet.

FIG. 2 shows an example of a step of attaching a semiconductor wafer surface protection sheet. As illustrated in FIG. 2, in the first step (attaching step), semiconductor wafer surface protection sheet 10 is attached to semiconductor wafer 20 under warming such that resin layer B 16 comes on the patterned surface of semiconductor wafer 20 on which semiconductor bumps 24 and the like are formed. As described above, porous circuit protection layer 22 may be formed on the patterned surface of semiconductor wafer 20.

Sheet attaching temperature may be set to 40° C. to 80° C., and sheet attaching pressure may be set to 0.3 MPa to 0.5 MPa. When the sheet attaching temperature is below 40° C., the elasticity of resin layer A is less likely to decrease and thus adjustability to surface irregularities decreases. On the other hand, sheet attaching temperature exceeding 80° C. is not preferable as process temperature. Attachment of the semiconductor wafer surface protection sheet can be accomplished using any known tape laminator.

In the second step (grinding step), the non-patterned surface (back surface) of the semiconductor wafer is ground to a given thickness with the semiconductor wafer surface protection sheet being attached to the patterned surface of the semiconductor wafer. The thickness of the semiconductor wafer after grinding may be, for example, 300 µm or less. Grinding is mechanical grinding by means of a grinding wheel. The grinding method is not particularly limited; grinding may be effected with a known grinding method such as through-feed grinding or in-feed grinding. In the second step (grinding step), generally, the temperature of the semiconductor wafer and the temperature of the semiconductor wafer surface protection sheet attached thereto are both within the range from 25° C. to less than 40° C.

In the third step (processing step), a step selected from the group consisting of metal sputtering, plating and heating may be conducted on the non-patterned surface (back surface) of the semiconductor wafer may be subjected to Heating step includes, for example, a step of attaching a die bonding tape under warming.

In the fourth step (peeling step), the semiconductor wafer surface protection sheet is peeled at ambient temperature. The method of peeling the semiconductor wafer surface protection sheet is not particularly limited; peeling can be accomplished using any known taper remover.

Figure 2B:
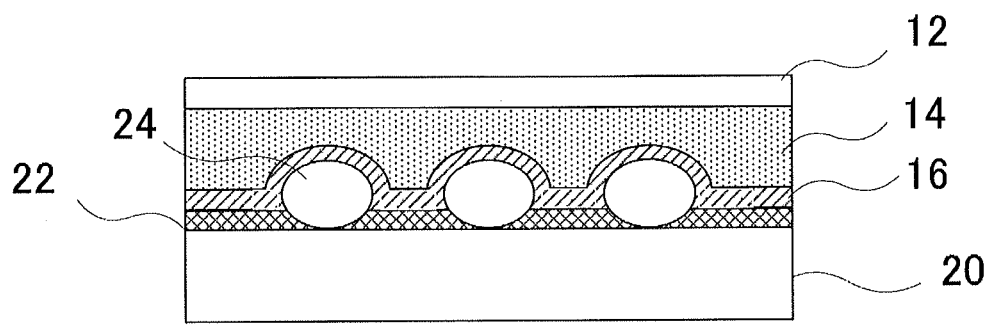

A semiconductor wafer surface protection sheet of the present invention includes resin layer A that exhibits hot melt property. Thus, in the first step (attaching step), as illustrated in FIG. 2B, the semiconductor wafer surface protection sheet can well adjust to relatively large irregularities (e.g., semiconductor bumps of 200 µm diameter or more) on the patterned surface of a semiconductor wafer, and thus can be in intimate contact with the semiconductor wafer without leaving any space. Good adhesion to the patterned surface of the semiconductor wafer can be ensured in the subsequent second step (grinding step) and third step (processing step) as well. Moreover, since resin layer B of the semiconductor wafer surface protection sheet is in contact with the irregularities on the patterned surface of the semiconductor wafer (see FIG. 2B), in the fourth step (peeling step), no adhesive residue is left on the patterned surface of the semiconductor wafer and therefore easy peeling can be realized.

A semiconductor wafer surface protection sheet of the present invention includes resin layer 13 that does not exhibit hot melt property. Thus, as illustrated in FIG. 2B, even when the semiconductor wafer surface protection sheet of the present invention is attached to a porous circuit protection film, it is possible to prevent the materials of resin layer A and resin layer B from flowing into the pores and thereby to achieve good peelability.

EXAMPLES

Examples 1 and 2

1. Measurement of Tensile Elasticity of Respective Layers

As a base film, a polyethylene terephthalate film (thickness: 75 µm) is provided. As a film for resin layer A, a 100 µm-thick film is provided which is obtained by extrusion molding of TAFMER P0275® (Mitsui Chemicals, Inc., density=861 kg/m$^3$). As a film for resin layer B, a 100 µm-thick film is provided which is obtained by extrusion molding of Notio PN 3560 manufactured by Mitsui Chemicals, Inc. Tensile elasticity is measured for these films in the procedure described below.

The films are each cut into a piece with an initial dimension of 14 cm length and 1 cm width to prepare sample films for measurement. Tensile test is then conducted under the following conditions to measure elongation (mm) of the sample film: measurement temperature=25° C., distance between chucks=100 mm, and tensile speed=50 mm/min. A tangent line is drawn to the initial rising section of the obtained stress-strain curve (S-S curve), and the gradient of the tangent line is divided by cross sectional area of the sample film to find tensile elasticity.

2. Fabrication of Semiconductor Wafer Surface Protection Sheet

As a base film, a 75 μm-thick polyethylene terephthalate (PET) film is provided. TAFMER P0275® (Mitsui Chemicals, Inc., density=861 kg/m$^3$) and Notio PN 3560 (Mitsui Chemicals, Inc.) are co-extruded onto the polyethylene terephthalate film, laminating thereon two layers of co-extruded resin formed of resin layers A and B. In this way a semiconductor wafer surface protection sheet is obtained. The thicknesses of the polyethylene terephthalate film, resin layer A and resin layer B of the semiconductor wafer surface protection sheet are 75 μm, 480 μm, and 3 μm, respectively.

3. Evaluation of Semiconductor Wafer Surface Protection Sheet

700 μm-thick semiconductor wafers having 250 μm-diameter solder ball bumps formed on the patterned surface are provided. Specifically, two semiconductor wafers are provided, one for Example 1 in which bump-to-bump interval is 250 μm, and the other for Example 2 in which bump-to-bump interval is 150 μm.

Using a tape laminator (LINTEC RAD 3510), the semiconductor wafer surface protection sheet is attached to the patterned surface of the semiconductor wafer by heat pressing under the following condition: wafer table temperature=70° C., roller temperature=40° C., pressure=0.5 MPa, roller laminate speed=2 ram/second.

The semiconductor wafer is then loaded on a back grinder (DISCO DFG8560), and the non-patterned surface of the semiconductor wafer is ground to a thickness of 300 μm.

Using a tape remover (RINTEC RAD3010), the semiconductor wafer surface protection sheet is peeled from the patterned surface of the semiconductor wafer at ambient temperature.

In these steps, irregularity accommodation ability, peelability and adhesive residue level of the semiconductor wafer sheet protection sheet, and thickness uniformity across the wafer after grinding, are evaluated as described below.

1) Irregularity Accommodation Ability of Semiconductor Wafer Surface Protection Sheet Using a microscope (KEYENCE), the patterned surface of the semiconductor wafers to which the semiconductor wafer surface protection sheet is attached is observed at 50-100× magnification for the presence of voids between irregularities on the patterned surface. The sheet that leaves void is evaluated as X, and the sheet that leaves no void is evaluated as O.

2) Thickness Uniformity across Wafer after Grinding

Using a micrometer (Mitutoyo 227-101), total thickness variation (TTV) of the semiconductor wafer after grinding is measured in accordance with JIS B7502 at 23° C., 50% RH. Specifically, wafer thickness is measured at 11 points, and the difference between the maximum and minimum values of thickness is measured to find TTV. The wafer with a TTV of not greater than 15 μm is evaluated as O, and the wafer with a TTV exceeding 15 μm is evaluated as X.

3) Peelability

Using a tape remover (RINTEC RAD3010), it is evaluated as to whether or not the semiconductor wafer surface protection sheet can be peeled from the patterned surface of the semiconductor wafer by 180 degree peel testing. Measurement is made at 23° C., 50% RH, and peeling speed of 300 mm/sec. The sheet that can be successfully peeled is evaluated as O, and the sheet that cannot be peeled or cannot be easily peeled is evaluated as X.

4) Adhesive Residue

The patterned surface of the semiconductor wafer from which the semiconductor wafer surface protection sheet has been peeled is observed with a microscope at 50-100× magnification. The wafer on which no adhesive residue is confirmed is evaluated as O, and the wafer on which adhesive residue is confirmed is evaluated as X.

Examples 3 and 4

Instead of the semiconductor wafer prepared in Example 1, semiconductor wafers having a porous circuit protection layer formed on the patterned surface are provided. The porous circuit protection layer is prepared in the procedure described below.

1) Synthesis of Polyhydroxyamide (Polybenzooxazol Precursor)

27.0 g (0.2 mol) of 1-hydroxybenzotriazol (KUROGANE KASEI Co., Ltd., HBT) is dissolved in 150 mL of N,N-dimethylacetylacetamide (Wako Pure Chem Industries, Ltd., DMAc), and the solution is cooled to −10° C. 20.2 g (0.2 mol) of triethylamine (Wako Pure Chem Industries, Ltd.) is added to the solution.

29.5 g (0.1 mol) of 4,4'-dicarbonylchloride diphenyl ether (NIHON NOHYAKU Co., Ltd., DEC) is dissolved in 150 mL of acetone, after which this solution: is added dropwise to the above-prepared mixture solution of HBT, DMAc and triethylamine while keeping the liquid temperature below 0° C. The solution is stirred for 2 hours at −10° C., warmed to room temperature, and stirred for a further 1 hour. After stirring, triethylamine hydrochloride is filtered and the filtrate is charged into 2 L of water to yield a white precipitate. The precipitate is collected by filtration and washed with acetone. Further, the precipitate is dried in a 50° C. vacuum drier for 48 hours to yield HBt ester of DEC.

18.3 g (0.05 mol) of bis(3-amino-4-hydroxyphenyl) hexafluoropropane (Bis-APAF, Central Glass Co., Ltd.) is dissolved in 200 ml of DMAc. To this solution is added 24.6 g (0.05 mol) of HBT ester of DEC and reacted for 6 hours at 50° C. to yield polyhydroxyamide in which Bis-APAF and DEC are joined by an amide bond (polybenzooxazol precursor). This solution is charged into 2 L of water. A white polymer precipitate is collected by filtration and washed with water. The polymer is dried in a 50° C. vacuum drier for 48 hours to yield polyhydroxyamide powder.

2) Synthesis of Photosensitizer A 42.4 g (0.1 mol) of 4,4-[1-[4-[1-(4-hydroxyphenyl)-1-methylethyl]phenyl]ethylidene]bisphenol (Tris-PPA, Honshu Chemical Industry, Co., Ltd.) is dissolved in 600 ml of 1,4-dioxane (Wako Pure Chem Industries, Ltd.). This solution is warmed to 40° C. and 67.1 g (0.25 mol) of 5-naphthoquinonediazide sulfonyl chloride (NAC-5, Toyo Gosei Co., Ltd.) is added. To this solution is added dropwise 25.3 g (0.25 mol) of triethylamine in 100 ml 1,4-dioxane while keeping the internal temperature below 45° C. After addition, the solution is stirred for 2 hours at 40° C. The solution is then cooled to room temperature, triethylamine hydrochloride is filtered, and the filtrate is charged into 3 L of water to yield a yellow precipitate. This precipitate is collected by filtration, washed with 1% hydrochloride aqueous solution (1 L) and then with water (3 L). The yellow precipitate is dried in a 50° C. vacuum drier for 48 hours to yield photosensitizer A.

3) Preparation of Photosensitive Polybenzooxazol Precursor Solution 20 g of the above polyhydroxyamide powder, 4.6 g of the above photosensitizer A, and 2.0 g of 4,4'-(1-(2-(4-hydroxyphenyl)-2-propylidene)bisphenol (Tris-PA, Honshu Chemical Industry, Co., Ltd.) are dissolved in 60 mL of γ-butyrolactone (Mitsubishi Chemical Corporation). The resultant solution is charged in a 100 mL-syringe and filtrated through a 0.45 μm pore diameter polytetrafluoroethylene filter (Advantech Co., Ltd.) to yield a photosensitive polybenzooxazol precursor solution.

4) Formation of Porous Protection Layer

Using a spreading/developing device (Clean Track Mark-7, Tokyo Electron Ltd.), the photosensitive polybenzooxazol precursor solution is applied onto a 6-inch wafer such that film thickness after hot plate baking is 7.8 μm. After hot plate baking, using i-line stepper (DSW-8750, GCA), the entire surface of the wafer is exposed at a dose of 3,000 J/cm$^2$ through a mask with a pattern of 100 μm×100 μm square apertures. After exposure, using the developing device of Mark-7, the formed film is developed by puddle development for 90 seconds with 2.35% tetramethyl ammonium hydroxide solution (ELM-D, Mitsubishi Gas Chemicals Co., Inc.). The developed polybenzooxazol precursor film is 7.1 μm in thickness.

The silicon wafer on which the polybenzooxazol precursor film is formed is placed in an inert oven (INH-21C, Koyo Thermo Systems Co., Ltd.), and heated at 140° C. for 30 minutes and, after raising temperature to 380° C. over 1 hour, heated at 380° C. for 1 hour. In this way a polybenzooxazol resin film is obtained. The polybenzooxazol resin film is then subjected to plasma treatment (reactive ion etching) for 3 minutes using a reactive ion etching apparatus (RIE-10, SAMCO) under the following condition: gas=$CF_4$, gas flow rate=50 sccm, pressure=0.6 Torr, output=280 W. In this way a porous circuit protection layer is obtained.

700 μm-thick semiconductor wafers having 250 μm-diameter solder ball bumps formed on the circuit protection layer are provided. Specifically, two semiconductor wafers are provided, one for Example 3 in which bump-to-bump interval is 250 μm, and the other for Example 4 in which bump-to-bump interval is 150 μm. Using the semiconductor wafers thus prepared and semiconductor wafer surface protection sheets prepared as in Example 1, evaluations are made for the semiconductor wafer surface protection sheets and the wafers after grinding.

Example 5

A semiconductor wafer surface protection sheet is obtained in the same manner as in Example 1 except that the thickness of resin layer B is changed to 20 μm. Evaluations for the semiconductor wafer surface protection sheet and a wafer after grinding are made in the same manner as in Example 3.

Example 6

A semiconductor wafer surface protection sheet is obtained in the same manner as in Example 3 except that, as resin for resin layer B, Notio PN3560 (Mitsui Chemicals, Inc.) is changed to Notio PN0040 (Mitsui Chemicals, Inc.). Evaluations for the semiconductor wafer surface protection sheet and a wafer after grinding are made in the same manner as in Example 3.

Example 7

A semiconductor wafer surface protection sheet is obtained in the same manner as in Example 3 except that, as resin for resin layer B, Notio PN3560 (Mitsui Chemicals, Inc.) is changed to Notio PN2060 (Mitsui Chemicals, Inc.). Evaluations for the semiconductor wafer surface protection sheet and a wafer after grinding are made in the same manner as in Example 3.

Example 8

A semiconductor wafer surface protection sheet is obtained in the same manner as in Example 3 except that, as resin for resin layer B, Notio PN3560 (Mitsui Chemicals, Inc.) is changed to hydrogenated styrene-butadiene rubber (HSBR). Evaluations for the semiconductor wafer surface protection sheet and a wafer after grinding are made in the same manner as in Example 3.

Example 9

A semiconductor wafer surface protection sheet is obtained in the same manner as in Example 3 except that resin prepared by adding 5 wt % polypropylene (PP) to Notio PN3560 (Mitsui Chemicals, Inc.) is used as resin for resin layer B. Evaluations for the semiconductor wafer surface protection sheet and a wafer after grinding are made in the same manner as in Example 3.

Example 10

A semiconductor wafer surface protection sheet is obtained in the same manner as in Example 3 except that a 20 μm-thick polyolefin layer (ADMER, Mitsui Chemicals, Inc.) is laminated onto a 75-μm thick polyethylene terephthalate layer for use as a base layer. Evaluations for the semiconductor wafer surface protection sheet and a wafer after grinding are made in the same manner as in Example 3.

Example 11

A semiconductor wafer surface protection sheet is obtained in the same manner as in Example 3 except that a 20 μm-thick ethylene-vinyl acetate copolymer (EVA) layer is laminated onto a 75-μm thick polyethylene terephthalate layer for use as a base layer. Evaluations for the semiconductor wafer surface protection sheet and a wafer after grinding are made in the same manner as in Example 3.

Comparative Example 1

A semiconductor wafer surface protection sheet is obtained in the same manner as in Example 3 except that an ethylene-vinyl acetate copolymer (EVA) layer is laminated onto a 75-μm thick polyethylene terephthalate layer for use as a base layer and that resin layer B is not formed. Evaluations for the semiconductor wafer surface protection sheet and a wafer after grinding are made in the same manner as in Example 3.

Comparative Example 2

A semiconductor wafer surface protection sheet is obtained in the same manner as in Example 3 except that thickness of resin layer B is changed to 100 μm. Evaluations for the semiconductor wafer surface protection sheet and a wafer after grinding are made in the same manner as in Example 3.

Comparative Example 3

A semiconductor wafer surface protection sheet is obtained in the same manner as in Comparative Example 2 except that resin layer A is changed to an ethylene-vinyl acetate copolymer (EVAFLEX EV420, DuPont-Mitsui Polychemicals, Co., Ltd.) layer having a thickness of 480 μm. Evaluations for the semiconductor wafer surface protection sheet and a wafer after grinding are made in the same manner as in Example 3.

Comparative Examples 4 and 5

Semiconductor wafer surface protection sheets are obtained in the same manner as in Example 3 except that, as resin used for resin layer B, Notio PN3560 (Mitsui Chemicals, Inc.) is changed to a UV curable adhesive prepared in the procedure described below. Evaluations for the semiconductor wafer surface protection sheets and wafers after grinding are made in the same manner as in Example 3 for Comparative Example 4 and in the same manner as in Example 2 for Comparative Example 5.

Preparation of Adhesive Polymer

A monomer mixture of 30 weight parts of ethyl acrylate, 40 weight parts of 2-ethylhexyl acrylate, 10 weight parts of methyl acrylate and 20 weight parts of glycidyl methacrylate is reacted for 10 hours at 80° C. in a mixture solvent of 65 weight parts of toluene and 50 weight of ethyl acetate in the presence of 0.8 weight parts of a benzoylperoxide polymerization initiator (NYPER BMT-K40, NOF Corporation) which is an initiator of 0.32 weight parts. After the completion of reaction, the resultant solution is cooled, 100 weight parts of xylene, 10 parts weight of acrylic acid and 0.3 weight parts of tetradecyldimethylbenzylammonium chloride (Cation M2-100, NOF Corporation) are added and reacted for 50 hours at 85° C. with air bubbling. In this way an acrylic adhesive polymer solution (adhesive main agent) is obtained.

Preparation of UV Curable Adhesive

To the acrylic adhesive polymer solution (adhesive main agent) is added, based on 100 weight parts of the polymer solid of the acrylic adhesive, 2 weight parts of benzyl dimethyl ketal (IRGACURE 651, Nihon Ciba-Geigy K.K.) as a cleavable photoinitiator, 0.3 weight parts of a mixture of dipentaerythritol hexaacrylate and dipentaerythritol monohydroxypentaacrylate (ARONIX M-400, Toagosei Chemical Industry Co., Ltd.) as monomers having a polymerizable carbon-carbon double bond in the molecule, and 1.35 weight parts of an isocyanate crosslinking agent (OLESTER P49-75-S, Mitsui Toatsu Chemicals, Inc.) (1 weight part as a thermal crosslinking agent) to produce a UV curable adhesive.

Evaluation results of Examples 1 to 11 are given in Table 1, and evaluation results of Comparative Examples 1 to 5 are given in Table 2.

TABLE 1

| | | | Ex. 1 | Ex. 2 | Ex. 3 | Ex. 4 | Ex. 5 | Ex. 6 |
|---|---|---|---|---|---|---|---|---|
| Sheet structure | Base layer | Material | PET | PET | PET | PET | PET | PET |
| | | E(25) (MPa) | 4000 | 4000 | 4000 | 4000 | 4000 | 4000 |
| | | Thickness (μm) | 75 | 75 | 75 | 75 | 75 | 75 |
| | Resin layer A | Material | TAFMER (P0275) | TAFMER (P0275) | TAFMER (P0275) | TAFMER (P0275) | TAFMER (P0275) | TAFMER (P0275) |
| | | E(25) (MPa) | 3.7 | 3.7 | 3.7 | 3.7 | 3.7 | 3.7 |
| | | E(60) (MPa) | 0.016 | 0.016 | 0.016 | 0.016 | 0.016 | 0.016 |
| | | E(60)/E(25) | 0.004 | 0.004 | 0.004 | 0.004 | 0.004 | 0.004 |
| | | Density (kg/m$^3$) | 861 | 861 | 861 | 861 | 861 | 861 |
| | | Thickness (μm) | 480 | 480 | 480 | 480 | 480 | 480 |
| | Resin layer B | Material | Notio PN 3560 | Notio PN 3560 | Notio PN 3560 | Notio PN 3560 | Notio PN 3560 | Notio PN 0040 |
| | | E(60) (MPa) | 4.5 | 4.5 | 4.5 | 4.5 | 4.5 | 2 |
| | | Thickness (μm) | 3 | 3 | 3 | 3 | 20 | 20 |
| Attaching condition | Temp. (° C.) | | 70 | 70 | 70 | 70 | 70 | 70 |
| | Pressure (MPa) | | 0.5 | 0.5 | 0.5 | 0.5 | 0.5 | 0.5 |
| Wafer | Patterned surface topology | | flat | flat | porous | porous | porous | porous |
| | Bump-to-bump distance (μm) | | 250 | 150 | 250 | 150 | 250 | 250 |
| Result | Irregularity accommodating ability | | ○ | ○ | ○ | ○ | ○ | ○ |
| | Thickness uniformity across wafer after grinding | | ○ | ○ | ○ | ○ | ○ | ○ |
| | Peelability | | ○ | ○ | ○ | ○ | ○ | ○ |
| | Adhesive residue | | ○ | ○ | ○ | ○ | ○ | ○ |

| | | | Ex. 7 | Ex. 8 | Ex. 9 | Ex. 10 | Ex. 11 |
|---|---|---|---|---|---|---|---|
| Sheet structure | Base layer | Material | PET | PET | PET | PET/Admer | PET/EVA |
| | | E(25) (MPa) | 4000 | 4000 | 4000 | 4000 | 4000 |
| | | Thickness (μm) | 75 | 75 | 75 | 75/20 | 75/20 |
| | Resin layer A | Material | TAFMER (P0275) | TAFMER (P0275) | TAFMER (P0275) | TAFMER (P0275) | TAFMER (P0275) |
| | | E(25) (MPa) | 3.7 | 3.7 | 3.7 | 3.7 | 3.7 |
| | | E(60) (MPa) | 0.016 | 0.016 | 0.016 | 0.016 | 0.016 |
| | | E(60)/E(25) | 0.004 | 0.004 | 0.004 | 0.004 | 0.004 |
| | | Density (kg/m$^3$) | 861 | 861 | 861 | 861 | 861 |
| | | Thickness (μm) | 480 | 480 | 480 | 480 | 480 |
| | Resin layer B | Material | Notio PN 2060 | HSBR | Notio PN | Notio PN 3560 | Notio PN 3560 |
| | | E(60) (MPa) | 4.9 | 1.5 | 4.8 | 4.5 | 4.5 |
| | | Thickness (μm) | 20 | 20 | 20 | 20 | 20 |
| Attaching condition | Temp. (° C.) | | 70 | 70 | 70 | 70 | 70 |
| | Pressure (MPa) | | 0.5 | 0.5 | 0.5 | 0.5 | 6.5 |
| Wafer | Patterned surface topology | | porous | porous | porous | porous | porous |
| | Bump-to-bump distance (μm) | | 250 | 250 | 250 | 250 | 250 |

TABLE 1-continued

| Result | Irregularity accommodating ability | ○ | ○ | ○ | ○ | ○ |
| --- | --- | --- | --- | --- | --- | --- |
| | Thickness uniformity across wafer after grinding | ○ | ○ | ○ | ○ | ○ |
| | Peelability | ○ | ○ | ○ | ○ | ○ |
| | Adhesive residue | ○ | ○ | ○ | ○ | ○ |

TABLE 2

| | | | Comp. Ex. 1 | Comp. Ex. 2 | Comp. Ex. 3 | Comp. Ex. 4 | Comp. Ex. 5 |
| --- | --- | --- | --- | --- | --- | --- | --- |
| Sheet structure | Base layer | Material | PET/EVA | PET | PET | PET | PET |
| | | E(25) (MPa) | 4000 | 4000 | 4000 | 4000 | 4000 |
| | | Thickness (μm) | 75/20 | 75 | 75 | 75 | 75 |
| | Resin layer A | Material | TAFMER (P0275) | TAFMER (P0275) | EVA (EV420) | TAFMER (P0275) | TAFMER (P0275) |
| | | E(25) (MPa) | 3.7 | 3.7 | 34.0 | 3.7 | 3.7 |
| | | E(60) (MPa) | 0.016 | 0.016 | 6.50 | 0.016 | 0.016 |
| | | E(60)/E(25) | 0.004 | 0.004 | 0.34 | 0.004 | 0.004 |
| | | Density (kg/m$^3$) | 861 | 861 | 960 | 861 | 861 |
| | | Thickness (μm) | 350 | 350 | 480 | 350 | 350 |
| | Resin layer B | Material | Not provided | Notio PN 3560 | Notio PN 3560 | UV curable adhesive | UV curable adhesive |
| | | E(60) (MPa) | — | 4.5 | 4.5 | 0.1 | 0.1 |
| | | Thickness (μm) | — | 100 | 20 | 40 | 40 |
| Attaching condition | Temp. (° C.) | | 70 | 70 | 70 | 70 | 70 |
| | Pressure (MPa) | | 0.5 | 0.5 | 0.5 | 0.5 | 0.5 |
| Wafer | Patterned surface topology | | Porous | Porous | Porous | Porous | Flat |
| | Bump-to-bump distance (μm) | | 250 | 250 | 250 | 250 | 150 |
| Result | Irregularity accommodating ability | | ○ | X | X | ○ | ○ |
| | Thickness uniformity across wafer after grinding | | ○ | X | X | ○ | ○ |
| | Peelability | | X (unpeelable) | ○ | ○ | X (less peelable) | X (less peelable) |
| | Adhesive residue | | X | ○ | ○ | X (adhesive remained) | X (adhesive remained) |

As can be seen from Table 1, the semiconductor wafer surface protection sheets of Examples 1 to 11 can well accommodate irregularities on the patterned surface of the semiconductor wafers, as well as exhibit good adhesion and wafer grinding stability. Moreover, it can be seen that the semiconductor wafer surface protection sheets of Examples 1 to 11 have good peelability from the patterned surface, particularly from the porous circuit protection film, without causing inflow of the adhesive material into the pores leading to adhesive residue. It can also be seen that these sheets have good peelability even when the bump-to-bump distance is short or when complex circuits are patterned.

On the other hand, as can be seen from Table 2, the semiconductor wafer surface protection sheet of Comparative Example 1, which does not have resin layer B, has good irregularity accommodation ability and grinding stability, but has insufficient peelability. It can also be seen that the semiconductor wafer surface protection sheet of Comparative Example 2, which has too thick resin layer B, less adjusts to surface irregularities and thus has low irregularity accommodation ability and low grinding stability. As demonstrated in Comparative Example 3, it can be seen that the semiconductor wafer surface protection sheet in which resin having E(60)/E(25) of 0.1 or more is used for resin constituting resin layer A less adjusts to surface irregularities and thus has low irregularity accommodation ability and low grinding stability. It can also be seen that the semiconductor wafer surface protection sheets of Comparative Examples 4 and 5, where tensile elasticity of resin layer B is less than 0.1 MPa, generate adhesive residue upon peeling and thus are less peelable.

INDUSTRIAL APPLICABILITY

A semiconductor wafer surface protection sheet of the present invention has good adhesion to irregularities on the patterned surface of a semiconductor wafer, and good peelability after grinding. Further, a semiconductor wafer surface protection sheet of the present invention may have good peelability from a porous circuit protection layer.

| | Reference Signs List |
| --- | --- |
| 10 | Semiconductor wafer surface protection sheet |
| 12 | Base film |
| 14 | Resin layer A |
| 16 | Resin layer B |
| 20 | Semiconductor wafer |
| 20A | Patterned surface |
| 22 | Circuit protection film |
| 24 | Solder bump |

The invention claimed is:
1. A semiconductor wafer surface protection sheet comprising:
a base layer having a tensile elasticity at 25° C., E(25), of 1 GPa or more;

a resin layer A that satisfies the condition $E_A(60)/E_A(25)$ <0.1, where $E_A(25)$ is a tensile elasticity at 25° C. and $E_A(60)$ is a tensile elasticity at 60° C., the $E_A(60)$ ranging from 0.005 MPa to 1 MPa; and a resin layer B having a tensile elasticity at 60° C., $E_B(60)$, of 1 MPa or more and having a thickness of 0.1 μm to less than 100 μm, the $E_B(60)$ being larger than the $E_A(60)$ of the resin layer A, wherein the resin layer A is disposed between the base layer and the resin layer B.

2. The semiconductor wafer surface protection sheet according to claim 1, wherein the resin layer B is disposed at an outermost surface of the semiconductor wafer surface protection sheet.

3. The semiconductor wafer surface protection sheet according to claim 1, wherein the resin layer A contains an olefin copolymer.

4. The semiconductor wafer surface protection sheet according to claim 1, wherein the resin layer A has a density of 800 kg/m³ to 890 kg/m³.

5. The semiconductor wafer surface protection sheet according to claim 1, wherein the resin layer B contains at least one resin selected from the group consisting of polyethylene elastomer and polystyrene elastomer.

6. The semiconductor wafer surface protection sheet according to claim 1, wherein the base film is at least one layer selected from the group consisting of a polyolefin film, a polyester film, and a laminate film of polyolefin layer and polyester layer.

7. The semiconductor wafer surface protection sheet according to claim 1, wherein thickness $t_A$ of the resin layer A is larger than a difference in level on a patterned surface of a semiconductor wafer.

8. A method of protecting a semiconductor wafer comprising:

a first step of attaching the semiconductor wafer surface protection sheet according to claim 1 to a patterned surface of the semiconductor wafer at 40° C. to 80° C. under a pressure of 0.3 MPa to 0.5 MPa;

a second step of grinding a non-patterned surface of the semiconductor wafer to which the semiconductor wafer surface protection sheet is attached;

a third step of processing the non-patterned surface of the semiconductor wafer after grinding; and a fourth step of peeling the semiconductor wafer surface protection sheet.

9. The method according to claim 8, wherein the patterned surface of the semiconductor wafer has a difference in level of 200 μm or higher.

10. The method according to claim 8, wherein the semiconductor wafer further includes a porous circuit protection layer attached to the patterned surface.

11. The method according to claim 8, wherein the third step includes at least one step selected from the group consisting of metal sputtering step, plating step, and heating step.

12. A method of manufacturing a semiconductor device comprising:

a first step of attaching the semiconductor wafer surface protection sheet according to claim 1 to a patterned surface of a semiconductor wafer at 40° C. to 80° C. under a pressure of 0.3 MPa to 0.5 MPa;

a second step of grinding a non-patterned surface of the semiconductor wafer to which the semiconductor wafer surface protection sheet is attached;

a third step of processing the non-patterned surface of the semiconductor wafer after grinding; and a fourth step of peeling the semiconductor wafer surface protection sheet.

13. The method according to claim 12, wherein the patterned surface of the semiconductor wafer has a difference in level of 200 μm or higher.

14. The method according to claim 12, wherein the semiconductor wafer further includes a porous circuit protection layer attached to the patterned surface.

15. The method according to claim 12, wherein the third step includes at least one step selected from the group consisting of metal sputtering step, plating step, and heating step.

* * * * *